(12) United States Patent
Tseng et al.

(10) Patent No.: US 12,367,930 B2
(45) Date of Patent: Jul. 22, 2025

(54) MEMORY DEVICE AND IN-MEMORY SEARCH METHOD THEREOF

(71) Applicant: MACRONIX International Co., Ltd., Hsinchu (TW)

(72) Inventors: Po-Hao Tseng, Taichung (TW); Tian-Cih Bo, Hsinchu County (TW); Feng-Min Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 197 days.

(21) Appl. No.: 18/173,096

(22) Filed: Feb. 23, 2023

(65) Prior Publication Data

US 2024/0221830 A1    Jul. 4, 2024

Related U.S. Application Data

(60) Provisional application No. 63/435,555, filed on Dec. 28, 2022.

(51) Int. Cl.
*G11C 15/04* (2006.01)
*G11C 16/04* (2006.01)
*G11C 16/26* (2006.01)

(52) U.S. Cl.
CPC .......... *G11C 15/04* (2013.01); *G11C 16/0483* (2013.01); *G11C 16/26* (2013.01)

(58) Field of Classification Search
CPC ..... G11C 15/04; G11C 16/0483; G11C 16/26; G11C 15/046
See application file for complete search history.

(56) References Cited

U.S. PATENT DOCUMENTS

| | | | |
|---|---|---|---|
| 6,317,349 B1 * | 11/2001 | Wong | G11C 15/046 365/49.17 |
| 6,339,539 B1 | 1/2002 | Gibson et al. | |
| 7,957,195 B2 * | 6/2011 | Fujito | G11C 7/04 365/185.21 |

(Continued)

FOREIGN PATENT DOCUMENTS

TW    I758188    3/2022

OTHER PUBLICATIONS

"Office Action of Taiwan Counterpart Application", issued on Feb. 20, 2024, pp. 1-4.

(Continued)

*Primary Examiner* — Mohammed A Bashar
(74) *Attorney, Agent, or Firm* — J.C. PATENTS

(57) ABSTRACT

A memory device and an in-memory search method thereof are provided. The memory device includes a first memory cell block, a second memory cell block, at least one search memory cell pair, and a sense amplifier. The search memory cell pair includes a first search memory cell and a second search memory cell. The first search memory cell and the second search memory cell are respectively disposed in the first memory cell block and the second memory cell block. The first search memory cell and the second search memory cell respectively receive a first search voltage and a second search voltage. The first search voltage and the second search voltage are generated according to searched data. The sense amplifier generates a search result according to signals on a first bit line and a second bit line.

20 Claims, 9 Drawing Sheets

(56) References Cited

U.S. PATENT DOCUMENTS

| | | |
|---|---|---|
| 8,564,998 B2 | 10/2013 | Inoue |
| 9,558,838 B2 * | 1/2017 | Tanabe .................... G11C 16/26 |
| 12,068,030 B2 * | 8/2024 | Tseng ................. G11C 16/0483 |
| 2004/0228155 A1 | 11/2004 | Patel |
| 2010/0232194 A1 | 9/2010 | Chu |

OTHER PUBLICATIONS

Po-Hao Tseng et al., "In-Memory-Searching Architecture Based on 3D-NAND Technology with Ultra-high Parallelism," 2020 IEEE International Electron Devices Meeting (IEDM), Dec. 2020, pp. 1-4.

Po-Hao Tseng et al., "A Hybrid In-Memory-Searching and In-Memory-Computing Architecture for NVM Based AI Accelerator," 2021 Symposium on VLSI Technology, Jun. 2021, pp. 1-2.

* cited by examiner

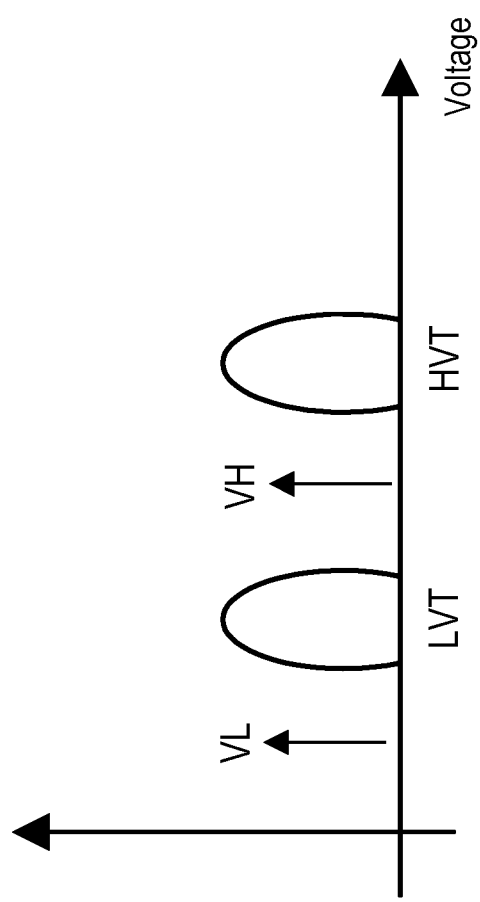

MEMORY DEVICE AND IN-MEMORY SEARCH METHOD THEREOF

CROSS-REFERENCE TO RELATED APPLICATION

This application claims the priority benefit of U.S. provisional application Ser. No. 63/435,555, filed on Dec. 28, 2022. The entirety of the above-mentioned patent application is hereby incorporated by reference herein and made a part of this specification.

BACKGROUND

Technical Field

The disclosure relates to a memory device and an in-memory search method thereof, and more particularly, to a memory device and an in-memory search method thereof which may increase a search data length.

Description of Related Art

With the rise of big data and AI hardware accelerators, data comparing/searching has become an indispensable function. In the existing technology, the so-called ternary content addressable memory (TCAM) may achieve highly parallel data search. In the conventional technology, the ternary content addressable memory is typically formed by static memory. Therefore, it often has issues of insufficient memory density and high power consumption.

Accordingly, in the conventional technology, it is proposed to use non-volatile memory to implement the ternary content addressable memory. However, in the conventional technology, two non-volatile memory cells are always required to store a piece of storage data. When search operation is performed, the two non-volatile memory cells are required to occupy two word lines, which reduces a data length of searched data during the search operation.

SUMMARY

The disclosure provides a memory device and an in-memory search method thereof, which may increase a data length of searched data and improve efficiency of search operation.

A memory device in the disclosure is configured to perform internal search operation. The memory device includes a first memory cell block, a second memory cell block, at least one search memory cell pair, and a sense amplifier. The search memory cell pair includes a first search memory cell and a second search memory cell. The first search memory cell and the second search memory cell are respectively disposed in the first memory block and the second memory block, and the first search memory cell and the second search memory cell respectively receive a first search voltage and a second search voltage. The first search voltage and the second search voltage are generated according to searched data. The sense amplifier is respectively coupled to the first search memory cell and the second search memory cell through a first bit line and a second bit line and generates a search result according to signals on the first bit line and the second bit line.

An in-memory search method in the disclosure includes the following. A first search memory cell and a second memory cell are respectively disposed in a first memory block and a second memory block. A search cell pair is formed by combining the first search memory cell and the second memory cell. The first search memory cell and the second search memory cell respectively receive a first search voltage and a second search voltage, and the first search voltage and the second search voltage are generated according to searched data. A sense amplifier is provided to generate a search result according to signals respectively provided by the first search memory cell and the second search memory cell through a first bit line and a second bit line respectively.

Based on the above, in the memory device of the disclosure, the first search memory cell and the second search memory cell in the search memory cell pair are respectively disposed in the different memory cell blocks. In this way, the number of bits of the searched data that may be received by word lines of the memory cell blocks may be doubled, effectively increasing the data length of the searched data in the in-memory search operation, and improving the efficiency of the search operation.

BRIEF DESCRIPTION OF THE DRAWINGS

FIG. 2B is a schematic view of a distribution state of a voltage value of a search voltage and a threshold voltage of a search memory cell.

DETAILED DESCRIPTION OF DISCLOSED EMBODIMENTS

Figure 1:
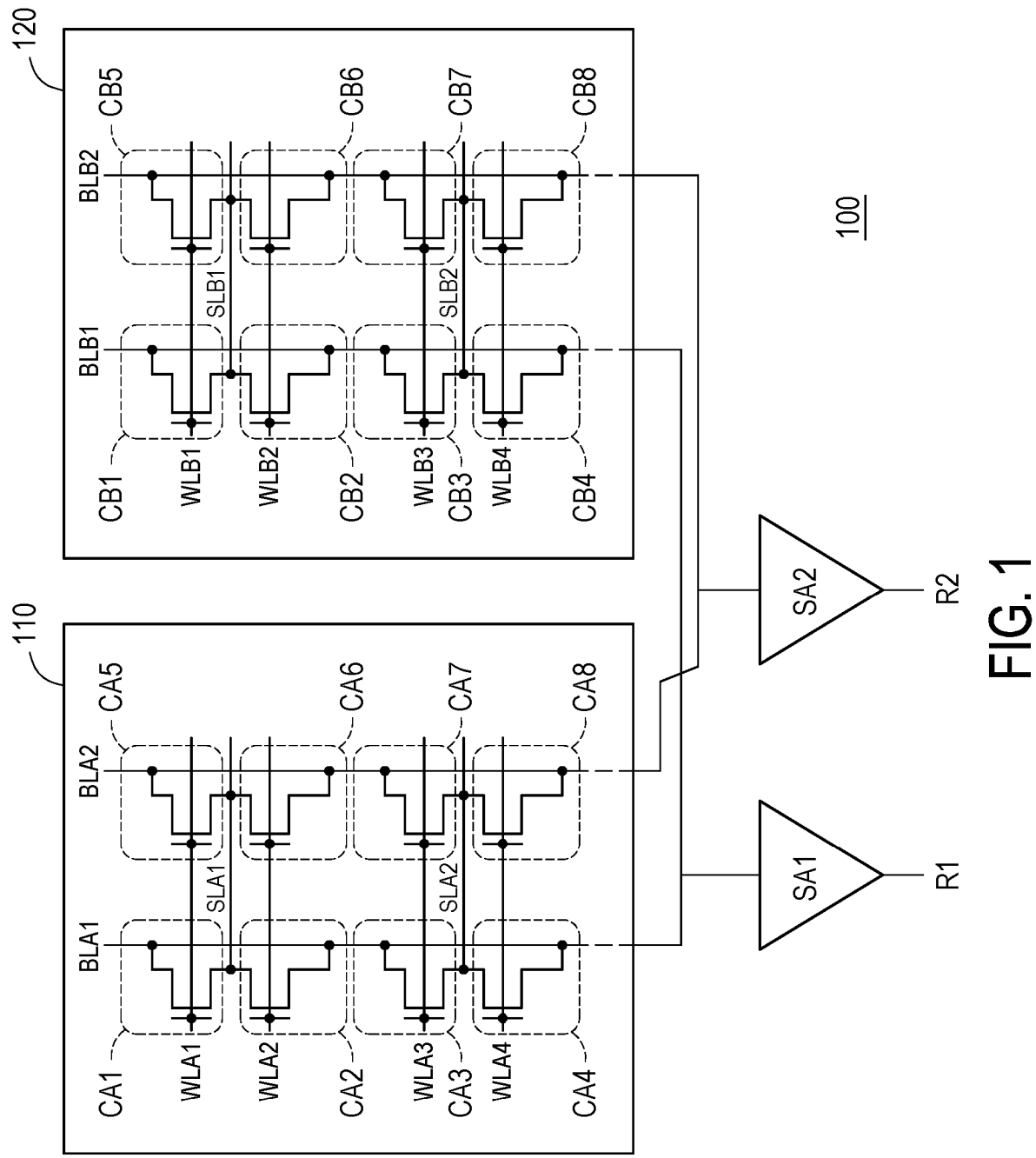
FIG. 1 is a schematic view of a memory device according to an embodiment of the disclosure.

Referring to FIG. 1, FIG. 1 is a schematic view of a memory device according to an embodiment of the disclosure. A memory device 100 is configured to perform internal search operation. The memory device 100 has memory cell blocks 110 and 120. The memory cell block 110 includes multiple search memory cells CA1 to CA8, and the memory cell block 120 includes multiple search memory cells CB1 to CB8. The search memory cells CA1 to CA4 are coupled to a same bit line BLA1, and the search memory cells CA5 to CA8 are coupled to a same bit line BLA2. The search memory cells CA1 and CA5 are coupled to a same word line WLA1. The search memory cells CA2 and CA6 are coupled to a same word line WLA2. The search memory cells CA3 and CA7 are coupled to a same word line WLA3. The search memory cells CA4 and CA8 are coupled to a same word line WLA4. The search memory cells CA1, CA2, CA5, and CA6 share a same source line SLA1, and the search memory cells CA3, CA4, CA7, and CA8 share a same source line SLA2.

In addition, the search memory cells CB1 to CB4 are coupled to a same bit line BLB1, and the search memory cells CB5 to CB8 are coupled to a same bit line BLB2. The search memory cells CB1 and CB5 are coupled to a same word line WLB1. The search memory cells CB2 and CB6 are coupled to a same word line WLB2. The search memory cells CB3 and CB7 are coupled to a same word line WLB3. The search memory cells CB4 and CB8 are coupled to a same word line WLB4. The search memory cells CB1, CB2, CB5, and CB6 share a same source line SLB1, and the search memory cells CB3, CB4, CB7, and CB8 share a same source line SLB2.

In this embodiment, the memory device 100 may be a NOR flash memory.

In this embodiment, the two search memory cells disposed in the different memory cell blocks 110 and 120 may form a search memory cell pair. For example, the search memory cells CA1 and CB1 may form a search memory cell pair, the search memory cells CA2 and CB2 may form a search memory cell pair, . . . , the search memory cells CA8 and CB8 may form a search memory cell pair. Taking the paired search memory cells CA1 and CB1 as an example, the search memory cells CA1 and CB1 may respectively receive a first search voltage and a second search voltage through the word lines WLA1 and WLB1. The first search voltage and the second search voltage may be generated according to searched data. In addition, the search memory cells CA1 and CB1 may determine whether to generate currents according to the received first search voltage and second search voltage respectively.

The memory device 100 further includes sense amplifiers SA1 and SA2. The sense amplifier SA1 is coupled to the bit lines BLA1 and BLB1, and generates a search result R1 by sensing currents on the bit lines BLA1 and BLB1. The sense amplifier SA2 is coupled to the bit lines BLA2 and BLB2, and generates a search result R2 by sensing currents on the bit lines BLA2 and the BLB2.

Figure 2A:
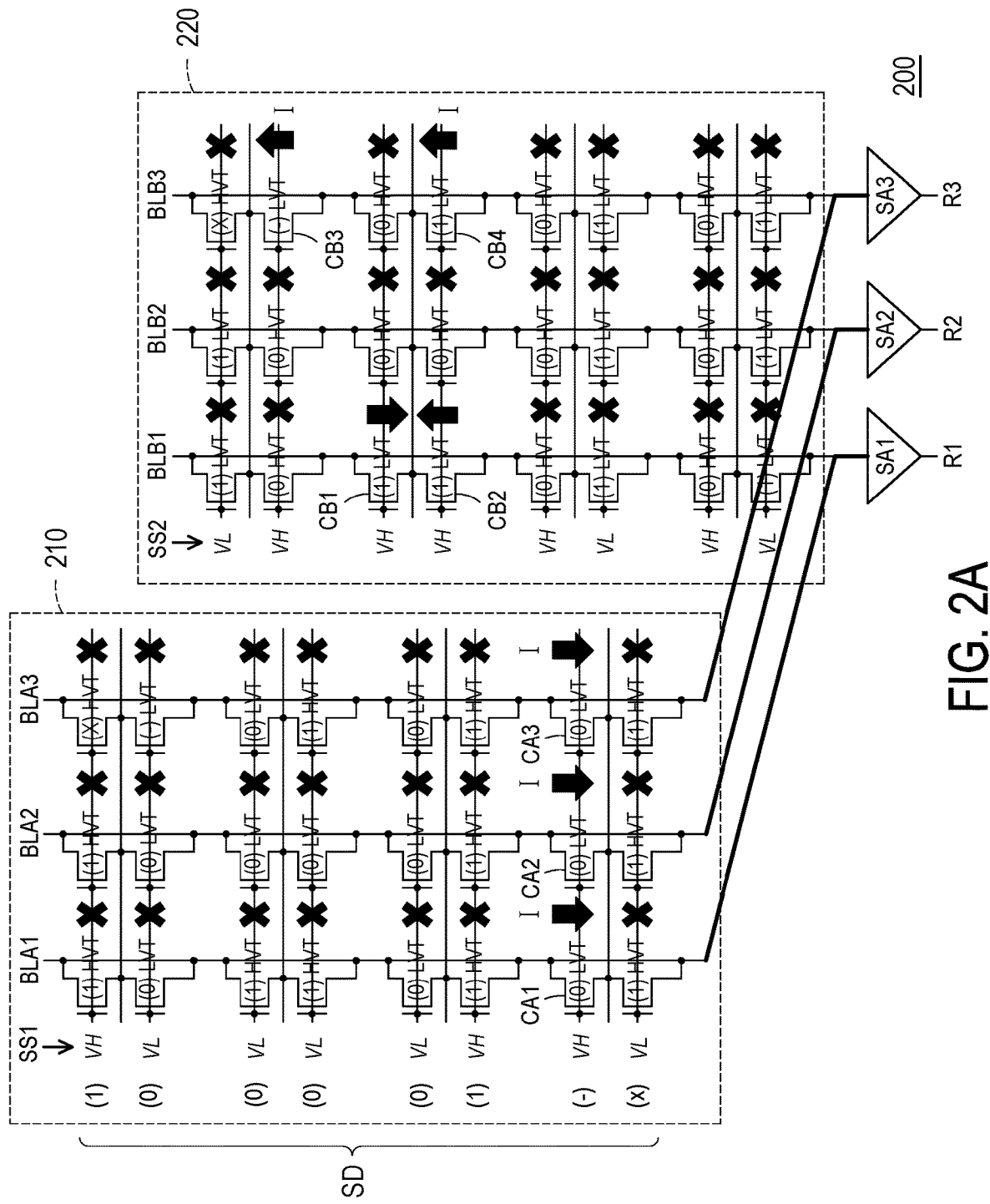
FIG. 2A is a schematic view of an implementation of in-memory search operation according to an embodiment of the disclosure.

Referring to FIG. 2A, FIG. 2A is a schematic view of an implementation of in-memory search operation according to an embodiment of the disclosure. In FIG. 2A, a memory device 200 includes memory cell blocks 210 and 220. The memory cell block 210 has bit lines BLA1 to BLA3, and each of the bit lines BLA1 to BLA3 is coupled to multiple search memory cells. The memory cell block 220 has bit lines BLB1 to BLB3, and each of the bit lines BLB1 to BLB3 is coupled to the search memory cells. The search memory cells in the memory cell block 210 are paired with the search memory cells in the memory cell block 220 to form a search memory cell pair. A pairing method has been described in detail in the embodiment of FIG. 1. Therefore, the same details will not be repeated in the following.

In this embodiment, the memory device 200 further includes sense amplifiers SA1 to SA3. The sense amplifier SA1 is coupled to the bit lines BLA1 and BLB1. The sense amplifier SA2 is coupled to the bit lines BLA2 and BLB2. The sense amplifier SA3 is coupled to the bit lines BLA3 and BLB3.

In this embodiment, each of the search memory cell pairs in the memory device 200 may record single-bit data. In the memory cell block 210, when storage data of the search memory cell is a logic value of 1, the search memory cell may be set to have a first threshold voltage. In contrast, when the storage data of the search memory cell is a logic value of 0, the search memory cell may be set to have a second threshold voltage. The first threshold voltage is greater than the second threshold voltage. In the memory cell block 220, when the storage data of the search memory cell is the logic value of 1, the search memory cell may be set to have the second threshold voltage. In contrast, when the storage data of the search memory cell is the logic value of 0, the search memory cell may be set to have the first threshold voltage. It is worth mentioning that when the storage data of the search memory cell is don't care (or referred to as wild card), the search memory cells in the search memory cell pair all have a relatively high first threshold voltage. When the storage data of the search memory cell is invalid, the search memory cells in the search memory cell pair all have a relatively low second threshold voltage. A state of the threshold voltage of the search memory cell in the storage data and the search memory cell pair may be seen in the following truth table.

| Storage data | Search memory cells in the memory cell block 210 | Search memory cells in the memory cell block 220 |
|---|---|---|
| 0 | LVT | HVT |
| 1 | HVT | LVT |
| Don't care "X" | HVT | HVT |
| Invalid "—" | LVT | LVT |

HVT is the relatively high first threshold voltage, and LVT is the relatively low second threshold voltage.

In this embodiment, the storage data that the search memory cells on the bit lines BLA1 and BLB1 may respectively store in sequence from the top to the bottom of the figure are logic values of 1, 0, 1, 1, 0, 1, 0, and 1. Therefore, the threshold voltages of the search memory cells on the bit line BLA1 may be HVT, LVT, HVT, HVT, LVT, HVT, LVT, and HVT in sequence from the top to the bottom of the figure. The threshold voltages of the search memory cells on the bit line BLB1 are complementary to the threshold voltages of the search memory cells on the bit line BLA1, which are LVT, HVT, LVT, LVT, HVT, LVT, HVT, and LVT respectively.

In addition, the storage data that the search memory cells on the bit lines BLA2 and BLB2 may respectively store in sequence from the top to the bottom of the figure are logic values 1, 0, 0, 0, 0, 1, 0, and 1. Therefore, the threshold voltages of the search memory cells on the bit lines BLA2 may be HVT, LVT, LVT, LVT, LVT, HVT, LVT, and HVT in sequence from the top to the bottom of the figure. The threshold voltages of the search memory cells on the bit line BLB2 are complementary to the threshold voltages of the search memory cells on the bit line BLA2, which are LVT, HVT, HVT, HVT, HVT, LVT, HVT, and LVT respectively. The storage data that the search memory cells on bit lines BLA3 and BLB3 may respectively store in sequence from the top to the bottom of the figure are logic values of X, −, 0, 1, 0, 1, 0, and 1. Therefore, the threshold voltages of the search memory cells on the bit line BLA3 may be HVT, LVT, LVT, HVT, LVT, HVT, LVT, and HVT in sequence from the top to the bottom of the figure. The threshold voltages of the search memory cells on the bit line BLB3 are complementary to the threshold voltages of the search memory cells on the bit line BLA3, which are HVT, LVT, HVT, LVT, HVT, LVT, HVT, and LVT respectively.

When the in-memory search operation is about to be performed, taking searched data SD as 1, 0, 0, 0, 0, 1, −, and X as an example, the memory device 200 may generate corresponding search voltages SS1 and SS2 according to a state of each of bits of the searched data SD. In this embodiment, the search voltage SS1 may be voltages VH, VL, VL, VL, VL, VH, VH, VL in sequence from the top to the bottom of the figure. The voltage VH is greater than the voltage VL. The voltage VH is between a distribution range of the threshold voltages VHT and VLT, and the voltage VL is lower than a distribution range of the threshold voltage VLT, as shown in a schematic view of a distribution state of a voltage value of the search voltage and the threshold voltage of the search memory cell in FIG. 2B. Correspondingly, when the search voltage SS2 may be the voltages VL, VH, VH, VH, VH, VL, VH, and VL in sequence from the top to the bottom of the figure.

In this embodiment, when the searched data SD is not don't care and invalid, the correspondingly generated search voltages SS1 and SS2 are complementary. When the searched data SD is don't care, the corresponding search voltages SS1 and SS2 are both the voltages VL. When the searched data SD is invalid, the corresponding search voltages SS1 and SS2 are both the voltages VH. In addition, when the searched data SD is don't care, the corresponding search result is required to be consistent, and when the searched data SD is invalid, the corresponding search result is required to be inconsistent.

A logic status of the voltage of the search voltage and the corresponding searched data may be shown in the following table.

| Storage data | Search voltage SS1 | Search voltage SS2 |
| --- | --- | --- |
| 0 | VL | VH |
| 1 | VH | VL |
| Don't care | VL | VL |
| Invalid | VH | VH |

When the in-memory search operation is performed, the search memory cell may be turned on and generate the current when the search memory cell has the threshold voltage LVT and receives the search voltage of the voltage VH. In other conditions, the search memory cell may be turned off. In detail, when the storage data of the search memory cell pair matches the searched data SD, the two search memory cells in the search memory cell pair are turned off without generating the current. When the storage data of the search memory cell pair does not match the searched data SD, at least one of the two search memory cells in the search memory cell pair may be turned on and generate the current.

In this embodiment, the search memory cells CA1 to CA3 may be turned on and generate a current I, and the search memory cells CB1 to CB4 may be turned on and generate the current I. Therefore, the sense amplifier SA1 may receive a current equal to 3I on the bit lines BLA1 and BLB1. The sense amplifier SA2 may receive a current equal to 1I on the bit lines BLA2 and BLB2. The sense amplifier SA3 may receive a current equal to 2I on the bit lines BLA3 and BLB3. The sense amplifier SA1 to SA3 may generate search results R1 to R3 respectively. The search result R1 indicates that a similarity level between the storage data of the search memory cells on the bit lines BLA1 and BLB1 and the searched data SD is same as a similarity level indicated by the search result R3 between the storage data of the search memory cells on the bit lines BLA3 and BLB3 and the searched data SD, where the similarity level indicated by the search results R3 and R1 is lower than a similarity level indicated by the search result R2. The search result R2 indicates that a similarity level between the storage data of the search memory cells on the bit lines BLA2 and BLB2 and the searched data SD is the highest. The search result R3 indicates that a similarity level between the storage data of the search memory cells on the bit lines BLA3 and BLB3 and the searched data SD is the highest. That is to say, the similarity level between the storage data of the search memory cells and the searched data SD is negatively correlated to magnitude of the current provided on the bit lines.

Figure 3A:
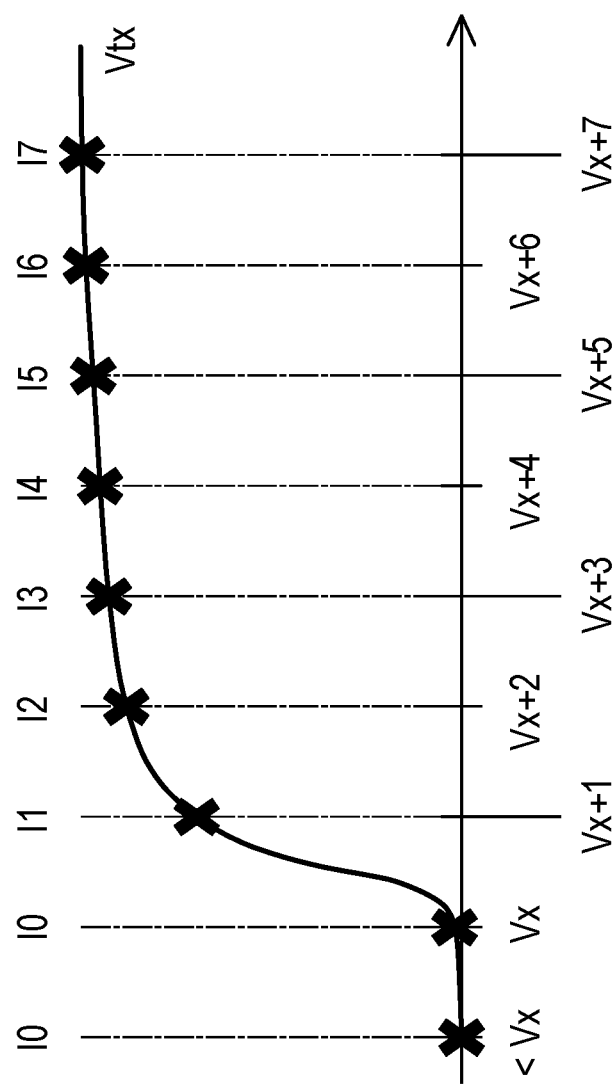
FIGS. 3A and 3B are schematic views of another implementation of in-memory search operation according to an embodiment of the disclosure.
Figure 3B:
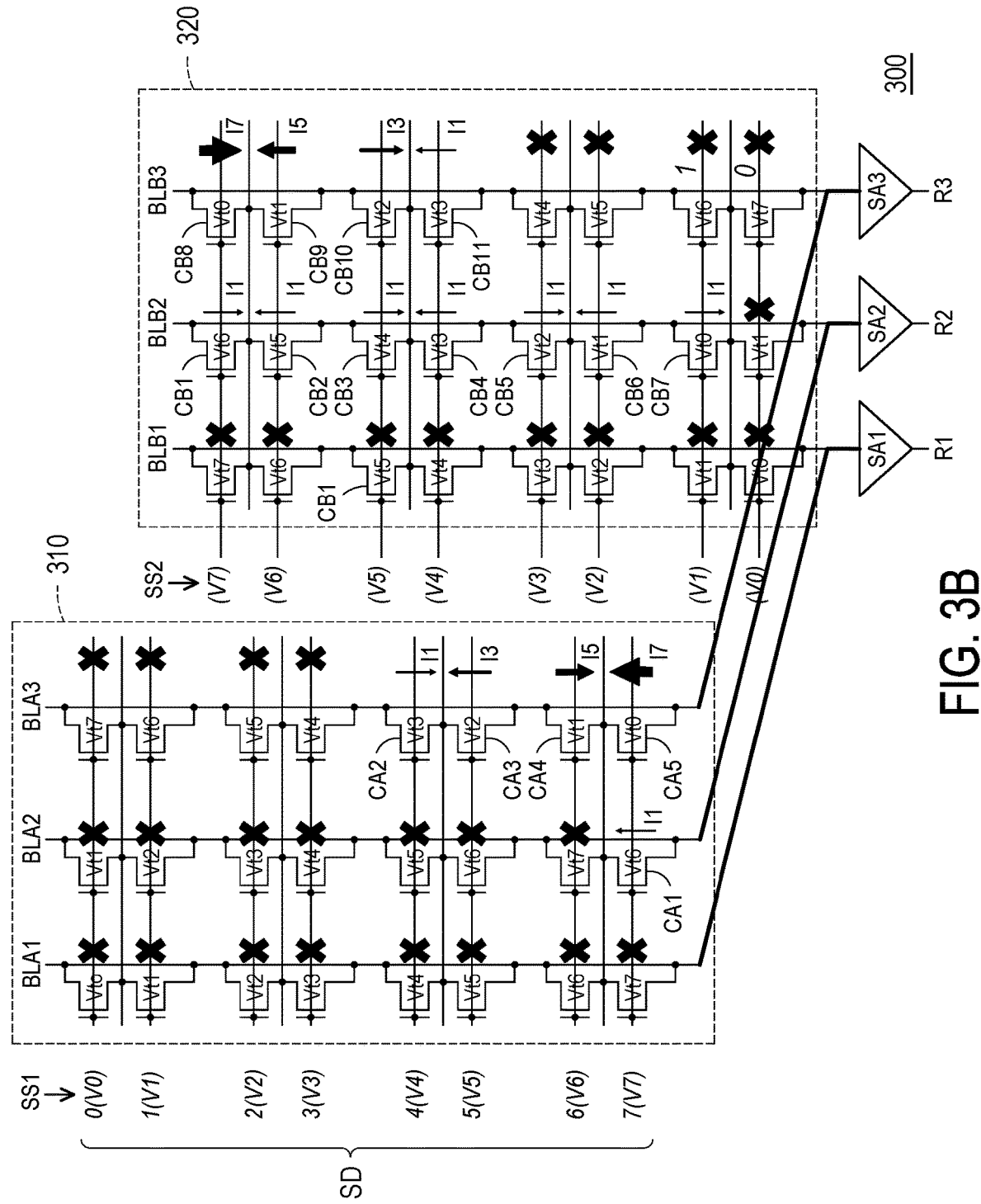

Referring to FIGS. 3A and 3B, FIGS. 3A and 3B are schematic views of another implementation of in-memory search operation according to an embodiment of the disclosure. In FIG. 3B, a memory device 300 includes memory cell blocks 310 and 320. The memory cell block 310 has the bit lines BLA1 to BLA3, and each of the bit lines BLA1 to BLA3 is coupled to the search memory cells. The memory cell block 320 has the bit lines BLB1 to BLB3, and each of the bit lines BLB1 to BLB3 is coupled to the search memory cells. The search memory cells in the memory cell block 310 are paired with the search memory cells in the memory cell block 320 to form a search memory cell pair. The pairing method has been described in detail in the embodiment of FIG. 1. Therefore, the same details will not be repeated in the following.

When the storage data of the search memory cell pair is multi-bit data, multiple voltages may be set to correspond to multiple possible logic values of the storage data. Corresponding to the storage data of the search memory cell pair, a threshold voltage of a first search memory cell in the search memory cell pair is set to one of the voltages, and a threshold voltage of a second search memory cell in the search memory cell pair is set to another one of the voltages.

In detail, the voltages may be a first voltage to an Nth voltage. The first voltage to the Nth voltage may be arranged in order from small to large. In this embodiment, the threshold voltage of the first search memory cell and the threshold voltage of the second search memory cell may be complementary, and may be shown in the following table.

| Storage data | Threshold voltage of the first search memory cell | Threshold voltage of the second search memory cell |
| --- | --- | --- |
| 0 | Vt 0 | Vt 7 |
| 1 | Vt 1 | Vt 6 |
| 2 | Vt 2 | Vt 5 |
| 3 | Vt 3 | Vt 4 |
| 4 | Vt 4 | Vt 3 |
| 5 | Vt 5 | Vt 2 |
| 6 | Vt 6 | Vt 1 |
| 7 | Vt 7 | Vt 0 |

In the above table, taking N equal to 8 as an example, the first voltage to the eighth voltage are threshold voltages Vt0 to Vt7 respectively, where the threshold voltages are Vt0<Vt1<Vt2< . . . <Vt7.

On the other hand, corresponding to the possible logic values of the searched data, the first search voltage applied to the memory cell block 310 may be one of a first set voltage to an Nth set voltage, and a second search voltage applied to the memory cell block 320 may be another one of the first set voltage to the Nth set voltage. The first set voltage to the Nth set voltage may be arranged in order from small to large. In this embodiment, corresponding to the same logic value of the searched data, the first search voltage and the second search voltage may be complementary, and may be shown in the following table.

| Searched data | First search voltage | Second search voltage |
| --- | --- | --- |
| 0 | V 0 | V 7 |
| 1 | V 1 | V 6 |
| 2 | V 2 | V 5 |
| 3 | V 3 | V 4 |
| 4 | V 4 | V 3 |
| 5 | V 5 | V 2 |

| Searched data | First search voltage | Second search voltage |
|---|---|---|
| 6 | V6 | V1 |
| 7 | V7 | V0 |

In the above table, taking N equal to 8 as an example, the first search voltage to the eighth search voltage are set voltages V0 to V7 respectively, where the set voltages are V0<V1<V2< . . . <V7.

In FIG. 3A, a threshold voltage Vtx of the search memory cell, received search voltages Vx to Vx+7, and magnitude of the current that may be generated by the search memory cell are shown. Taking x=0 as an example, when the search memory cell has the threshold voltage Vt0, and the received search voltages are the set voltages V0 to Vx, the search memory cell may generate currents I0, I0, I1, I2, I3, I4, I5, I6, and I7, where the current I0 is substantially equal to 0.

It is worth mentioning that FIG. 3A only shows a transfer curve of the search memory cell, and it does not mean that all the search voltages Vx to Vx+7 in FIG. 3A are required to be generated when the in-memory search operation is performed.

In FIG. 3B, the search memory cell pairs on the bit lines BLA1 and BLB1 respectively store the storage data of logic values 0, 1, 2, 3, 4, 5, 6, and 7 in sequence from the top to the bottom of FIG. 3B. Therefore, the search memory cells on the bit line BLA1 have the threshold voltages Vt0, Vt1, Vt2, Vt3, Vt4, Vt5, Vt6, and Vt7 in sequence from the top to the bottom of FIG. 3B. The search memory cells on the bit line BLB1 have the threshold voltages Vt7, Vt6, Vt5, Vt4, Vt3, Vt2, Vt1, and Vt0 in sequence from the top to the bottom of FIG. 3B.

The search memory cell pairs on the bit lines BLA2 and BLB2 respectively store the storage data of logic values 1, 2, 3, 4, 5, 6, 7, and 6 in sequence from the top to the bottom of FIG. 3B. Therefore, the search memory cells on the bit line BLA2 have the threshold voltages Vt1, Vt2, Vt3, Vt4, Vt5, Vt6, Vt7, and Vt6 in sequence from the top to the bottom of FIG. 3B. The search memory cells on the bit line BLB2 have the threshold voltages Vt6, Vt5, Vt4, Vt3, Vt2, Vt1, Vt0, and Vt1 in sequence from the top to the bottom of FIG. 3B.

In addition, the search memory cell pairs on bit lines BLA3 and BLB3 respectively store the storage data of logic values 7, 6, 5, 4, 3, 2, 1, and 0 in sequence from the top to the bottom of FIG. 3B. Therefore, the search memory cells on the bit line BLA3 have the threshold voltages Vt7, Vt6, Vt5, Vt4, Vt3, Vt2, Vt1, and Vt0 in sequence from the top to the bottom of FIG. 3B. The search memory cells on the bit line BLB3 have the threshold voltages Vt0, Vt1, Vt2, Vt3, Vt4, Vt5, Vt6, and Vt7 in sequence from the top to the bottom of FIG. 3B.

On the other hand, logic values of the searched data SD may be 0, 1, 2, 3, 4, 5, 6, and 7 in sequence from the top to the bottom of FIG. 3B. The search voltage SS1 generated corresponding to the searched data SD may be the search voltages V0, V1, V2, V3, V4, V5, V6, and V7 in sequence from the top to the bottom of FIG. 3B. in addition, the voltage search SS2 may be the search voltages V7, V6, V5, V4, V3, V2, V1, and V0 in sequence from the top to the bottom of FIG. 3B.

According to the transfer curve in FIG. 3A, in the embodiment of FIG. 3B, in the memory cell block 310, the search memory cell CA1 may generate the current I1. The search memory cell CA2 may generate the current I1. The search memory cell CA3 may generate the current I3. The search memory cell CA4 may generate the current I5. The search memory cell CA5 may generate the current I7. In memory cell block 320, each of the search memory cells CB1 to CB7 and CB11 may generate the current I1. The search memory cell CB10 may generate the current I3. The search memory cell CB9 may generate the current I5. The search memory cell CB8 may generate the current I7. The rest of the search memory cells may be turned off and provide a current close to 0 (e.g. the current I0).

The sense amplifier SA1 may receive the currents (close to 0) on the bit lines BLA1 and BLB1. The sense amplifier SA2 may receive the currents (=8*I1) on the bit lines BLA2 and BLB2. The sense amplifier SA3 may receive the currents (=2*I1+2*I5+2*I7) on the bit lines BLA3 and BLB3. In this way, the similarity level indicated by the search result R1 generated by the sense amplifier SA1 is higher than the similarity level indicated by the search result R2 generated by the sense amplifier SA2. In addition, the similarity level indicated by the search result R2 generated by the sense amplifier SA2 is higher than the similarity level indicated by the search result R3 generated by the sense amplifier SA3.

Figure 4A:
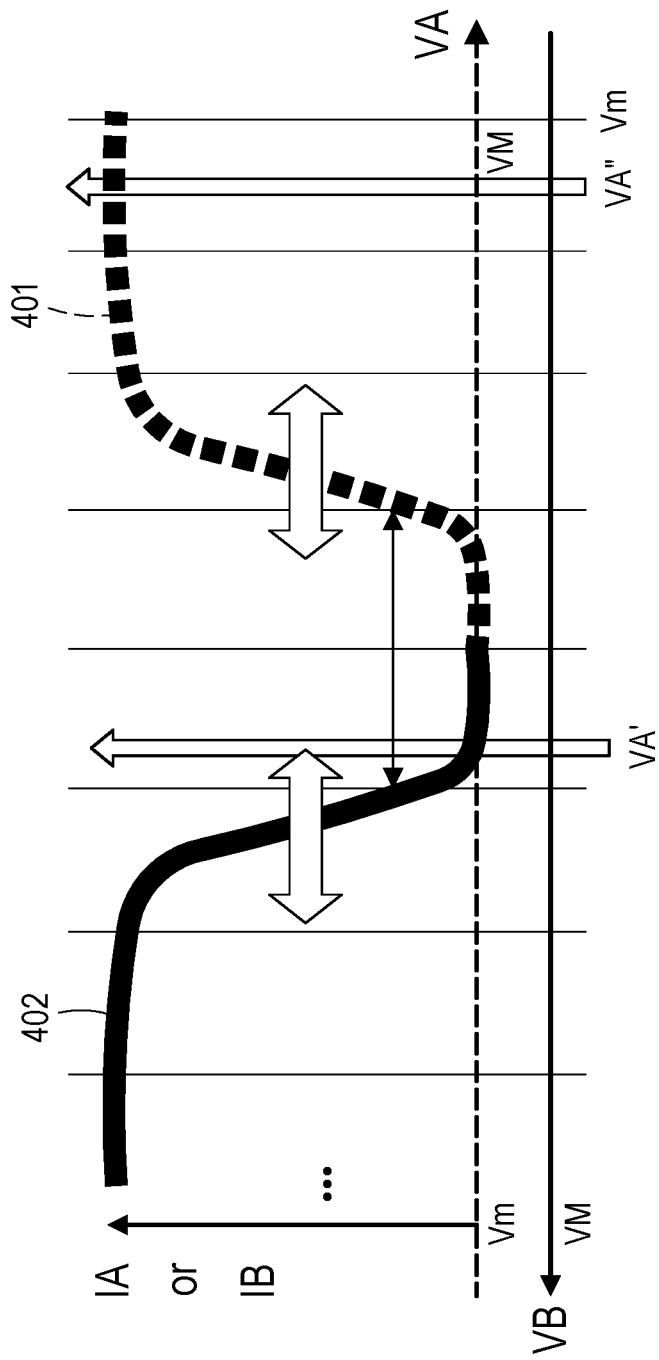
FIGS. 4A and 4B are schematic views of another implementation of in-memory search operation according to an embodiment of the disclosure.
Figure 4B:
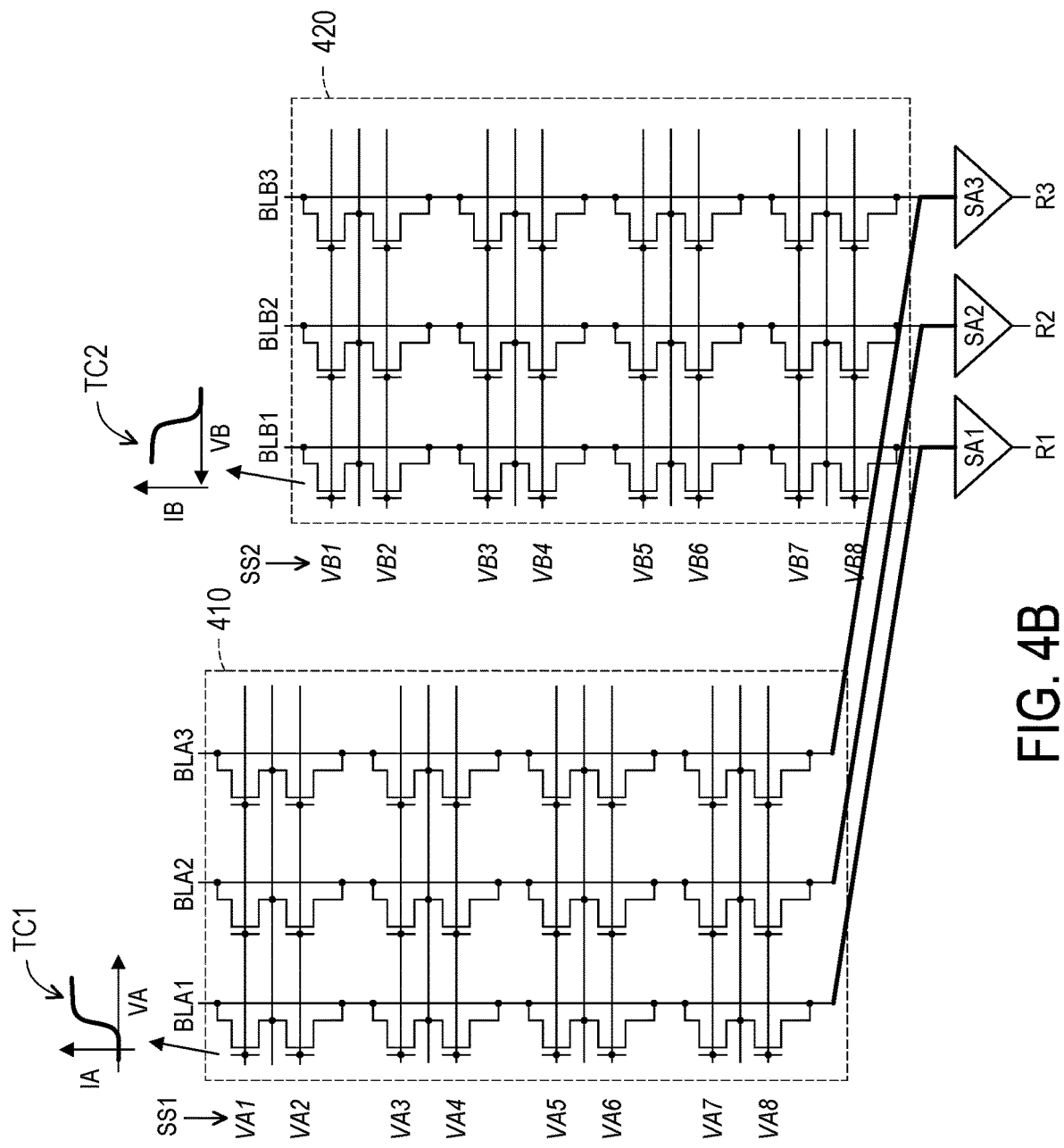

Referring to FIGS. 4A and 4B, FIGS. 4A and 4B are schematic views of another implementation of in-memory search operation according to an embodiment of the disclosure. In FIG. 4B, a memory device 400 includes memory cell blocks 410 and 420. The memory cell block 410 has the bit lines BLA1 to BLA3, and each of the bit lines BLA1 to BLA3 is coupled to the search memory cells. The memory cell block 420 has the bit lines BLB1 to BLB3, and each of the bit lines BLB1 to BLB3 is coupled to the search memory cells. The search memory cells in the memory cell block 410 are paired with the search memory cells in the memory cell block 420 to form a search memory cell pair. The pairing method has been described in detail in the embodiment of FIG. 1. Therefore, the same details will not be repeated in the following.

In FIG. 4A, a transfer curve 401 is a transfer curve of a first search memory cell in the memory cell block 410, and a transfer curve 402 is a transfer curve of a second search memory cell in the memory cell block 420. In FIG. 4A, the transfer curve 401 corresponds to a horizontal axis of a dash line, and the transfer curve 402 corresponds to a horizontal axis of a solid line. In addition, a vertical axis is a current IA generated by the first search memory cell or a current IB generated by the second search memory cell. In this embodiment, the search memory cell pair is configured to store analog storage data. The first search memory cell and the second search memory cell may be changed between a minimum voltage Vm and a maximum voltage VM respectively according to the corresponding storage data.

Regarding the setting of the search voltage, a first search voltage VA provided to the memory cell block 410 may be generated according to the searched data, and a second search voltage VB provided to the memory cell block 420 may be equal to a sum of the minimum voltage Vm and the maximum voltage VM minus the first search voltage VA (VB=Vm+VM−VA).

In this embodiment, when a search voltage VA' is located in a turn-off region of the search memory cell, the search memory cell does not generate the current and indicates that the search result is consistent. When a search voltage VA" is not located in the turn-off region of the search memory cell, at least one of the search memory cells in the search memory cell pair may generate the current and indicates that the search result is inconsistent.

In FIG. 4B, the threshold voltages of the search memory cells in the memory cell block 410 may be adjusted correspondingly according to the storage data, and have characteristics of a transfer curve TC1. The threshold voltages of the search memory cells in the memory cell block 420 may also be adjusted correspondingly according to the storage data, and have characteristics of a transfer curve TC2.

Corresponding to the searched data, the search voltage SS1 may be equal to voltages VA1 to VA8 in sequence from the top to the bottom of FIG. 4B. The search voltage SS2 may be calculated and obtained according to the voltages VA1 to VA8, the maximum voltage VM, and the minimum voltage Vm, and be equal to voltages VB1 to VB8 in sequence from the top to the bottom of FIG. 4B. It is worth noting that when the first search voltage is large enough, the second search voltage is at least equal to the minimum voltage Vm. When the first search voltage is small enough, the second search voltage is at most equal to the maximum voltage VM.

The sense amplifier SA1 is coupled to the bit lines BLA1 and BLB1. The sense amplifier SA2 is coupled to the bit lines BLA2 and BLB2. The sense amplifier SA3 is coupled to the bit lines BLA3 and BLB3. The sense amplifiers SA1 to SA3 respectively generate the search results R1, R2, and R3 according to the currents on the coupled bit lines BLA1, BLB1, BLA2, BLB2, BLA3, and BLB3. The similarity level indicated by the search results R1, R2, and R3 are negatively correlated to the currents on the bit lines BLA1, BLB1, BLA2, BLB2, BLA3, and BLB3 respectively received by the sense amplifiers SA1 to SA3.

Figure 5:
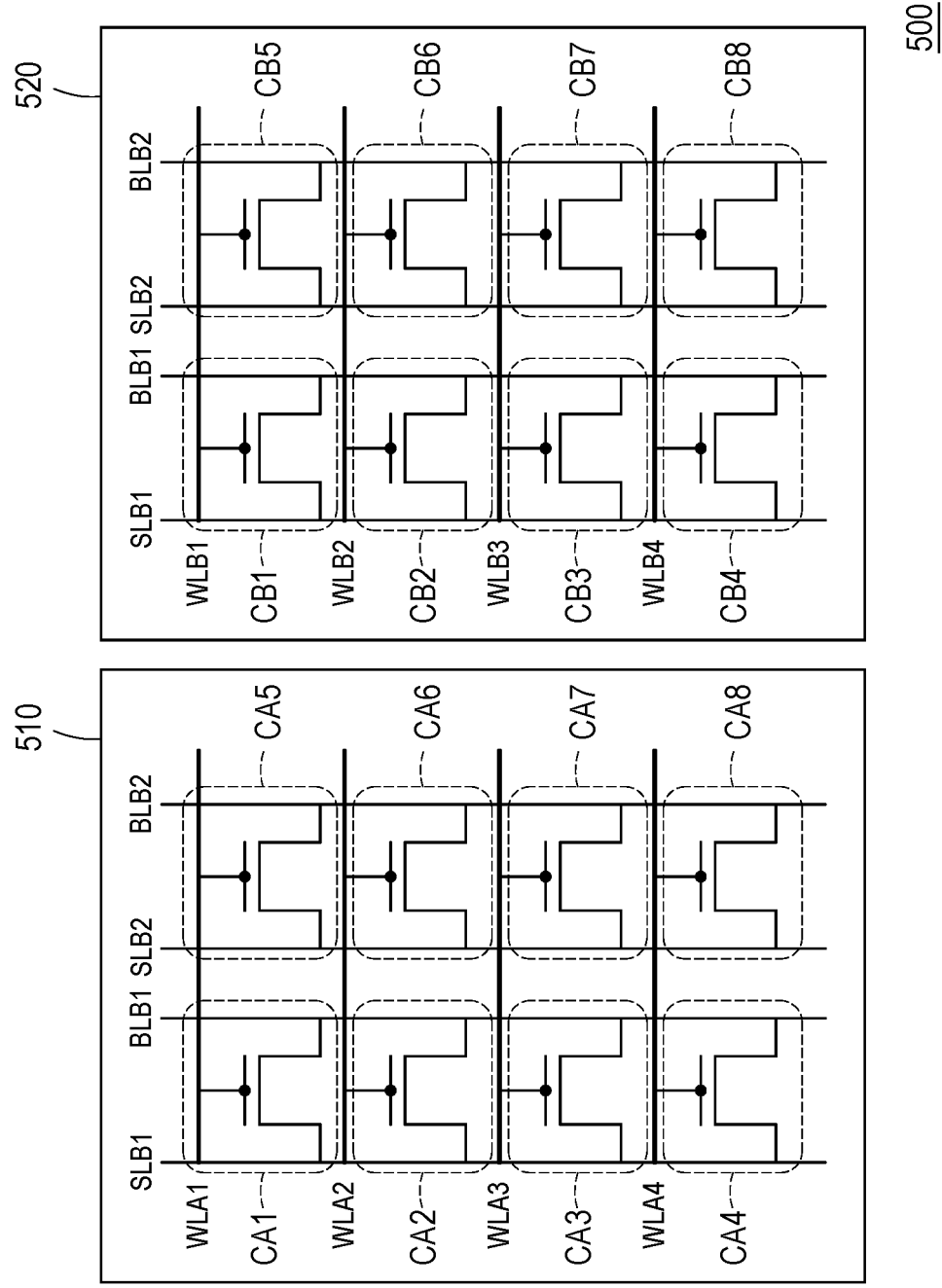
FIG. 5 is a schematic view of a memory device according to another embodiment of the disclosure.

Referring to FIG. 5, FIG. 5 is a schematic view of a memory device according to another embodiment of the disclosure. A memory device 500 is configured to perform the internal search operation. The memory device 500 has memory cell blocks 510 and 520. The memory cell block 510 includes the search memory cells CA1 to CA8, and the memory cell block 520 includes the search memory cells CB1 to CB8. The search memory cells CA1 to CA4 are coupled to the same bit line BLA1, and the search memory cells CA5 to CA8 are coupled to the same bit line BLA2.

The search memory cells CA1 and CA5 are coupled to the same word line WLA1. The search memory cells CA2 and CA6 are coupled to the same word line WLA2. The search memory cells CA3 and CA7 are coupled to the same word line WLA3. The search memory cells CA4 and CA8 are coupled to the same word line WLA4. The search memory cells CA1, CA2, CA3, and CA4 share the same source line SLA1, and the search memory cells CA5, CA6, CA7, and CA8 share the same source line SLA2.

In addition, the search memory cells CB1 to CB4 are coupled to the same bit line BLB1, and the search memory cells CB5 to CB8 are coupled to the same bit line BLB2. The search memory cells CB1 and CB5 are coupled to the same word line WLB1. The search memory cells CB2 and CB6 are coupled to the same word line WLB2. The search memory cells CB3 and CB7 are coupled to the same word line WLB3. The search memory cells CB4 and CB8 are coupled to the same word line WLB4. The search memory cells CB1, CB2, CB3, and CB4 share the same source line SLB1, and the search memory cells CB5, CB6, CB7, and CB8 share the same source line SLB2.

In this embodiment, the memory device 500 may be the NOR flash memory.

Figure 6:
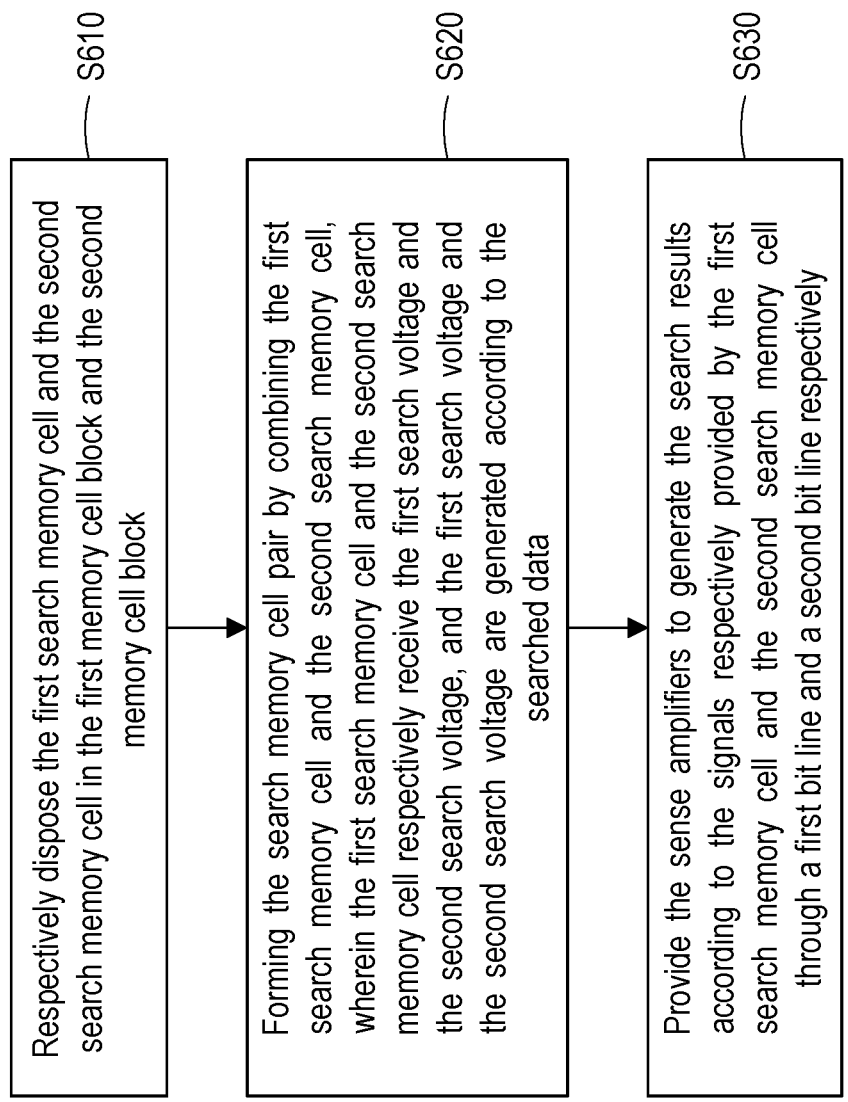
FIG. 6 is a flowchart of an in-memory search method according to an embodiment of the disclosure.

Hereinafter referring to FIG. 6, FIG. 6 is a flowchart of an in-memory search method according to an embodiment of the disclosure. In step S610, the first search memory cell and the second search memory cell are respectively disposed in the first memory cell block and the second memory cell block. In step S620, the first search memory cell and the second search memory cell form the search memory cell pair. The first search memory cell and the second search memory cell respectively receive the first search voltage and the second search voltage, and the second search voltage is generated according to the searched data. In step S630, the sense amplifiers are provided to generate the search results according to the signals respectively provided by the first search memory cell and the second search memory cell through a first bit line and a second bit line respectively.

Implementation details of the above steps have been described in detail in the foregoing embodiments and implementations. Therefore, the same details will not be repeated in the following.

Based on the above, in the disclosure, the two search memory cells in the different memory cell blocks are used to form the search memory cell pair, and the search memory cell pair is used to store the storage data. In this way, when the search operation is performed, all the word lines in the memory cell block may receive the search voltage generated according to the searched data. That is to say, in one search operation, the search data length provided by the memory device in the disclosure may be increased, effectively improving the efficiency of the in-memory search operation.

What is claimed is:

1. A memory device, being configured to perform in-memory search operation, comprising:
 a first memory block;
 a second memory block;
 at least one search cell pair, comprising a first search memory cell and a second search memory cell, wherein the first search memory cell and the second search memory cell are respectively disposed in the first memory block and the second memory block, and the first search memory cell and the second search memory cell respectively receive a first search voltage and a second search voltage, wherein the first search voltage and the second search voltage are generated according to searched data; and
 a sense amplifier, respectively coupled to the first search memory cell and the second search memory cell through a first bit line and a second bit line and generating a search result according to signals on the first bit line and the second bit line,
 wherein the first memory block coupled to a plurality of first word lines, the second memory block coupled to a plurality of second word lines, the first word lines are different from the second word lines, and bit lines of the first memory block are different from bit lines of the second memory block.

2. The memory device according to claim 1, wherein when storage data of the at least one search memory cell pair is single-bit data, logic values of the first search voltage and the second search voltage are complementary, and when the storage data is a first logic value, the first search memory cell has a first threshold voltage, the second search memory cell has a second threshold voltage, and the first threshold voltage is different from the second threshold voltage.

3. The memory device according to claim 2, wherein when the storage data of the at least one search memory cell pair is don't care, both the first search memory cell and the second search memory cell have the first threshold voltage, wherein the first threshold voltage is greater than the second threshold voltage.

4. The memory device according to claim 3, wherein when the storage data of the at least one search memory cell pair is invalid, both the first search memory cell and the second search memory cell have the second threshold voltage.

5. The memory device according to claim 2, wherein when the storage data of the at least one search memory cell pair matches the searched data, both the first search memory cell and the second search memory cell are turned off, and when the storage data of the at least one search memory cell pair does not match the searched data, at least one of the first search memory cell and the second search memory cell is turned on.

6. The memory device according to claim 1, wherein when storage data of the at least one search memory cell pair is multi-bit data, corresponding to a logic value of the storage data, a threshold voltage of the first search memory cell is one of a first voltage to an Nth voltage, and a threshold voltage of the second search memory cell is another one of the first voltage to the Nth voltage, wherein the first voltage to the Nth voltage are arranged in order from small to large.

7. The memory device according to claim 5, wherein corresponding to a plurality of logic values of the searched data, the first search voltage is one of a first set voltage to an Nth set voltage, and the second search voltage is another one of the first set voltage to the Nth set voltage.

8. The memory device according to claim 5, wherein when the storage data of the at least one search memory cell pair matches the searched data, both the first search memory cell and the second search memory cell are turned off, and when the storage data of the at least one search memory cell pair does not match the searched data, the first search memory cell and the second search memory cell determine whether to generate a first current and a second current respectively according to a similarity level between the storage data and the searched data.

9. The memory device according to claim 1, wherein when storage data of the at least one search memory cell pair is analog data, threshold voltages of the first search memory cell and the second search memory cell are adjusted between a maximum voltage and a minimum voltage according to the storage data, the first search voltage is generated according to the searched data, and the second search voltage is equal to a sum of the maximum voltage and the minimum voltage minus the first search voltage.

10. The memory device according to claim 9, wherein the first search memory cell and the second search memory cell respectively provide a first current and a second current according to a similarity level between the storage data and the searched data, and magnitude of the first current and the second current is negatively correlated to the similarity level between the storage data and the searched data.

11. An in-memory search method, comprising:
respectively disposing a first search memory cell and a second memory cell in a first memory block and a second memory block, wherein the first memory block coupled to a plurality of first word lines, the second memory block coupled to a plurality of second word lines, the first word lines are different from the second word lines, and bit lines of the first memory block are different from bit lines of the second memory block;
forming a search cell pair by combining the first search memory cell and the second memory cell, wherein the first search memory cell and the second search memory cell respectively receive a first search voltage and a second search voltage, and the first search voltage and the second search voltage are generated according to searched data; and providing a sense amplifier to generate a search result according to signals respectively provided by the first search memory cell and the second search memory cell through a first bit line and a second bit line respectively.

12. The in-memory search method according to claim 11, wherein when storage data of the at least one search memory cell pair is single-bit data, logic values of the first search voltage and the second search voltage are complementary, and when the storage data is a first logic value, the first search memory cell has a first threshold voltage, the second search memory cell has a second threshold voltage, and the first threshold voltage is different from the second threshold voltage.

13. The in-memory search method according to claim 12, wherein when the storage data of the at least one search memory cell pair is don't care, both the first search memory cell and the second search memory cell have the first threshold voltage, wherein the first threshold voltage is greater than the second threshold voltage.

14. The in-memory search method according to claim 13, wherein when the storage data of the at least one search memory cell pair is invalid, both the first search memory cell and the second search memory cell have the second threshold voltage.

15. The in-memory search method according to claim 12, wherein when the storage data of the at least one search memory cell pair matches the searched data, both the first search memory cell and the second search memory cell are turned off, and when the storage data of the at least one search memory cell pair does not match the searched data, at least one of the first search memory cell and the second search memory cell is turned on.

16. The in-memory search method according to claim 11, wherein when storage data of the at least one search memory cell pair is multi-bit data, corresponding to a logic value of the storage data, a threshold voltage of the first search memory cell is one of a first voltage to an Nth voltage, and a threshold voltage of the second search memory cell is another one of the first voltage to the Nth voltage, wherein the first voltage to the Nth voltage are arranged in order from small to large.

17. The in-memory search method according to claim 15, wherein the first search voltage is one of a first set voltage to an Nth set voltage, and the second search voltage is another one of the first set voltage to the Nth set voltage.

18. The in-memory search method according to claim 15, wherein when the storage data of the at least one search memory cell pair matches the searched data, both the first search memory cell and the second search memory cell are turned off; and
when the storage data of the at least one search memory cell pair does not match the searched data, the first search memory cell and the second search memory cell determine whether to generate a first current and a second current respectively according to a similarity level between the storage data and the searched data.

19. The in-memory search method according to claim 11, wherein when storage data of the at least one search memory cell pair is analog data, threshold voltages of the first search memory cell and the second search memory cell are adjusted between a maximum voltage and a minimum voltage according to the storage data; and
the first search voltage is generated according to the searched data, and the second search voltage is equal to a sum of the maximum voltage and the minimum voltage minus the first search voltage.

20. The in-memory search method according to claim 19, further comprising:

respectively providing, by the first search memory cell and the second search memory cell, a first current and a second current according to a similarity level between the storage data and the searched data, wherein magnitude of the first current and the second current is negatively correlated to the similarity level between the storage data and the searched data.

\* \* \* \* \*